(12) United States Patent
Lee

(10) Patent No.: US 7,089,465 B2
(45) Date of Patent: Aug. 8, 2006

(54) MULTI-PORT MEMORY DEVICE HAVING SERIAL I/O INTERFACE

(75) Inventor: Ihl-Ho Lee, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 208 days.

(21) Appl. No.: 10/877,318

(22) Filed: Jun. 25, 2004

(65) Prior Publication Data
US 2005/0251713 A1    Nov. 10, 2005

(30) Foreign Application Priority Data
May 6, 2004    (KR) .................. 10-2004-0031980

(51) Int. Cl.
*G11C 29/00*    (2006.01)
(52) U.S. Cl. ..................... 714/718; 714/733
(58) Field of Classification Search ................ 711/108; 714/718, 733; 365/233, 230.05
See application file for complete search history.

(56) References Cited

U.S. PATENT DOCUMENTS 4,982,360 A * 1/1991 Johnson et al. ............. 711/108
5,910,181 A * 6/1999 Hatakenaka et al. ........ 714/718
6,661,735 B1 * 12/2003 Lee ............................ 365/233
6,771,558 B1 * 8/2004 Kim ........................... 365/233
6,996,027 B1 * 2/2006 Shin .......................... 365/233
7,006,402 B1 * 2/2006 Park et al. ............. 365/230.05

* cited by examiner

Primary Examiner—David Ton
(74) Attorney, Agent, or Firm—Blakely Sokoloff Taylor & Zafman

(57) ABSTRACT

The multi-port memory device includes a plurality of ports supporting serial I/O interface, and the plurality of ports includes a transmission pad and a reception pad. The multi-port memory device includes: a memory core; a control block for generating an internal command signal, an internal address and a control signal, which correspond to the command and are necessary for an operation of the memory core, using commands and addresses inputted to the plurality of ports packet form; and a mode selection block for combining signals applied to plurality of mode selection pads and generating a test mode flag signal, in which I/O data assigned to the transmission pad and the reception pad in a test mode in response to the test mode flag signal are exchanged with the memory core through the ports.

5 Claims, 13 Drawing Sheets

US 7,089,465 B2

MULTI-PORT MEMORY DEVICE HAVING SERIAL I/O INTERFACE

FIELD OF THE INVENTION

The present invention relates to a semiconductor memory design technology; and, more particularly, to a test related technology of a multi-port memory device having a serial I/O interface.

DESCRIPTION OF RELATED ART

Most of memory devices, including a random access memory (RAM), have one port. Also, one port has a plurality of input/output pin sets. In other words, the memory device has only one port for data exchange with chipset. However, in recent years, a function separation between the memory device and the chipset has been ambiguous and an integration of the chipset and the memory device has been considered. This tendency demands a multi-port memory device that can directly exchange data with peripheral graphic devices, CUP, and so on. In order to implement such a multi-port memory device, any one of a plurality of ports must be able to provide an access to all memory cells.

Most of memory devices including RAM use parallel I/O interface. In other words, data are exchanged in parallel with external circuits through a plurality of I/O pins (DQ).

The I/O interface is an electrical and mechanical treatment method for correctly transferring transmission/reception information when communication is processed by connecting a different functional unit to a signal line. This signal line is called a bus. The bus includes a data bus, a control bus, a ground bus, and so on. The number of bus lines is changed depending on an interface.

Since a parallel I/O interface can transfer several-bit data through several lines at the same time, the efficiency (rate) is excellent, but the number of lines increases. Therefore, if a distance is long, a transmission cost increases. For this reason, the parallel I/O interface is widely used in a short distance transmission, which requires a fast rate.

A serial I/O interface transmits/receives data through one line. Therefore, compared with the parallel I/O interface, the serial I/O interface has a disadvantage in view of a rate, but has an advantage of simplification in view of a hardware and control. However, compared with the parallel transmission method, the serial transmission method is not always slow.

Meanwhile, considering the disadvantage of the parallel I/O interface, an attempt to changing the parallel I/O interface into the serial I/O interface has been made continuously. Also, considering the expansion of compatibility with other serial I/O interface devices, interface of RAM needs to be changed into the serial I/O interface. The above-described multi-port memory device has a plurality of ports. Therefore, if the parallel I/O interface is used, the number of pads and pins increases in proportion to the number of ports, resulting in a difficulty of packaging. Accordingly, it is profitable for the multi-port memory device to adopt the serial I/O interface.

FIG. 1 is a block diagram illustrating an architecture of a 256M multi-port DRAM, which is disclosed in Korean Patent Application No. 2003-92375, filed by the same applicant on Dec. 17, 2003.

Referring to FIG. 1, the 256M multi-port DRAM includes a plurality of memory cells and a plurality of row decoders RDEC. The 256M multi-port DRAM includes a plurality of banks bank0 to bank15, a control block 100, a plurality of ports port0 to port7, first to fourth global data buses GIO_UL, GIO_UR, GIO_DL and GIO_DR, first and second global data bus connection blocks, a plurality of transfer buses TB, a plurality of transfer bus connection blocks TG, a plurality of bus connection blocks TL, and a plurality of data transfer blocks QTRX.

The plurality of banks bank0 to bank15 are arranged in a row direction (a right and left direction in the drawing) as many as a predetermined number at four divided sections (quarters) of a core area.

The control block 100 is arranged between the first/third quarters and the second/fourth quarters to divide the core area into two sections. The control block 100 generates an internal command signal, an internal address signal and a control signal using an inputted command, addresses, and so on, and controls respective elements of the memory device.

The plurality of ports port0 to port7 are arranged at edge portions of the respective quarters and perform an independent communication with different target devices.

The first to fourth global data buses GIO_UL, GIO_UR, GIO_DL and GIO_DR are arranged between each bank and each port corresponding to the respective quarters in a row direction and perform a parallel data transmission.

The first and second global data bus connection blocks PR_U and PR_D are arranged between two global data buses, which are adjacent to each other in a row direction, and selectively connect the two global data buses.

The plurality of transfer buses TB are arranged in a column direction (an up and down direction in the drawing) of each bank and perform a data transmission inside the banks The plurality of transfer bus connection blocks TG arranged between two banks, which are adjacent to each other in a column direction, and selectively connect the two transfer buses TB.

The plurality of bus connection blocks TL are arranged between each bank and each global data bus of the quarter in which each bank is contained, and perform a data exchange between the corresponding transfer bus TB and the corresponding global data bus.

The plurality of data transfer blocks QTRX are arranged between each port and each global data bus of the quarter in which each port is contained, and perform a data transmission/reception between the corresponding port and the corresponding global data bus.

A detailed structure of the 256M multi-port DRAM will now be described.

Each of the sixteen banks bank0 to bank15 includes 16M DRAM cells (8 k(row) 2 k(column)) and the row decoder RDEC. Each bank includes a core circuit, such as a bit line sense amplifier and an equalizer, which is necessary in a typical DRAM core. The banks bank0 to bank15 are arranged at the four quarters, each of which includes four banks in a row direction. In detail, the banks bank0, bank2, bank4 and bank6 are arranged at the first quarter (a left and up section) of the core area, and the banks bank8, bank10, bank12 and bank14 are arranged at the second quarter (a right and up section). Also, the banks bank1, bank3, bank5 and bank7 are arranged at the third quarter (a left and down section), and the banks bank9, bank11, bank 13 and bank15 are arranged at the fourth quarter (a right and down section). Meanwhile, it is preferable that each row decoder RDEC is arranged to pair a row decoder RDEC of an adjacent bank at one side of each bank. One page (column) is divided into four segments, each of which consists of 512 cells.

The control block 100 generates internal command signals, internal address signals, and control signals using the command and addresses, which are transmitted in a packet form, and controls the respective elements of the memory device. Here, the internal command signals include an internal activation command signal (ACT), an internal inactivation command signal (PCG), an internal read command signal (RD), an internal write command signal (WD), and so on. The internal address signals include an activation array address (AAA), an inactivation array address (PAA), a read array address (RAA), a write array address (WAA), a row address (RA), a read segment address (RSA), a write segment address (WSA), and so on. The control signals include a transfer gate control signal (TGC), a pipe register flag signal (PRFG), a pipe register data driving signal (DP), a DRAM core test mode flag signal (DTM), and so on.

The ports port0 to port7 are arranged at die edge portions of the respective quarters, each of which includes two ports. The die edge portion means a major axis portion shared by all banks of the corresponding quarter. In detail, the ports port0 and port2 are arranged at the first quarter, and the ports port4 and port6 are arranged at the second quarter. The ports port1 and port3 are arranged at the third quarter, and the ports prot5 and port7 are arranged at the fourth quarter. Each port supports a serial I/O interface and performs an independent communication with different target devices (for example, chipset, graphic chip, etc.). Meanwhile, in case where the ports port0 to port7 are configured to support the serial I/O interface, each of the ports port0 to port7 includes a plurality of pads corresponding to data, addresses and commands, a pad buffer (a read buffer, a write buffer) for buffering transmission/reception signals transferred to the pad, a decoder for decoding the received data, an encoder for encoding the data to be transmitted, and a data converter for converting a received serial data into a parallel data and converting a parallel data to be transmitted into a serial data.

The first global data bus GIO_UL is arranged between the banks and the ports of the first quarter, and the second global data bus GIO_UR is arranged at the second quarter. The third global data bus GIO_DL is arranged at the third quarter, and the fourth global data bus GIO_DR is arranged at the fourth quarter. The first to fourth global data buses GIO_UL, GIO_UR, GIO_DL and GIO_DR are bi-directional data buses (512 bits), which are connected to the banks, ports and global data bus connection blocks PR_U and PR_D of the corresponding quarters, respectively.

Meanwhile, the first and second global data buses GIO_UL and GIO_UR can be connected to each other through the first global data bus connection block PR_U, and the third and fourth global data buses GIO_DL and GIO_DR can be connected to each other through the second global data bus connection block PR_D. The first and second global data bus connection blocks PR_U and PR_D include bi-directional pipe registers corresponding to the number (512) of the lines of the global data buses.

Also, the transfer buffers TB are local data buses for connecting the bit line sense amplifiers and the bus connection blocks TL of the corresponding banks. The number of the lines of the transfer buses TB is identical to the number (for example, 512) of the cells corresponding to one segment and the transfer buses TB are configured with differential buses.

The transfer bus connection blocks TG can be configured with MOS transistors, the number of which is identical to the number of the lines of the transfer buses TB. Because the transfer buses TB are the differential buses, one transfer bus connection block TG can be configured with 512 pairs of MOS transistors. For this reason, the transfer bus connection block TG is called a transfer gate.

Also, the bus connection block TL includes a total of sixteen sets, each of which is 512 transfer latches. Each of the transfer latches is provided with a read bus connection circuit (an I/O sense amplifier of DRAM) and a write bus connection circuit (a write driver of DRAM). Here, the read bus connection circuit includes a read sense amplifier for sensing and latching a read data, which is applied on the transfer bus TB, and a read driver for driving the latched data to the global data bus of the quarter to which the corresponding bank belongs. The write bus connection circuit includes a write latch for sensing and latching a write data, which is applied on the global data bus, and a write driver for driving the write data to the transfer bus TB.

The data transfer block TR includes 512 transmitters (Tx) for transmitting write data applied on a corresponding port to the global data bus, and 512 receivers (Rx) for receiving read data applied from the global data bus and transmitting the read data to a corresponding port.

Although not shown in the drawing, the 256M multi-port DRAM further includes a voltage generator, a test logic, and a variety of pads. The voltage generator is arranged at each edge portion of the die and is configured to receive an external voltage to generate an internal voltage. The test logic is arranged between the ports corresponding to the first and second quarters and between the ports corresponding to the third and fourth quarters. The pads include a clock pad arranged at the edge portion of the die.

Command lines (ACT, PCG, RD, WD) and address lines (AAA<0:1>, PAA<0:1>, RAA<0:1>, RA<0:12>, RSA<0:1>), which extend from the control block 100 to the corresponding banks, are provided at the respective quarters. Transfer gate control lines (TGC<0:3>) extending from the control block 100 to the transfer bus connection block TG are provided at the right and left sides of the control block 100.

FIG. 2 is a block diagram illustrating the segment and the transfer bus TB in the 256M multi-port DRAM of FIG. 1.

Referring to FIG. 2, like a general DRAM, the 256M multi-port DRAM includes a plurality of memory cell arrays 200 and a plurality of bit line sense amplifier arrays 210. In view of one memory cell array 200, a pair of transfer buses TB<0> and TBb<0> are connected to four bit line sense amplifiers BLSA that are arranged at upper and lower portions of the memory cell array 200 (refer to a box A). The four bit line sense amplifiers BLSA are controlled by different segment selection signals SGS<0:3>. The segment selection signal is a signal corresponding to a column selection signal (Yi) of the general DRAM. In case of 2 k columns, if one row and one segment are selected, 512 cells are selected at the same time, such that data exchange with the corresponding 512-bit transfer buses TB<0:511> is achieved.

Meanwhile, the transfer buses TB corresponding to each bank of the first quarter can be connected through the transfer gates TG to the transfer buses TB corresponding to each bank of the third quarter, which is arranged on the same column axis (512 transfer gates TG are configured as one set and a total of 8 sets are provided). In other words, the transfer gates TG are arranged between the transfer buses TB corresponding to two banks (which is defined as an array) arranged on the same column axis and selectively connects two transfer buses TB. A control signal TGC for controlling the transfer gates TG is generated from the control block 100.

An operation of the 256M multi-port DRAM will now be described.

FIGS. 3A and 3B illustrate a normal read path and a normal write path of the 256M multi-port DRAM shown in FIG. 2, respectively.

First, an operation of reading out 512-bit data from a specific segment of the bank bank0 through the port port0 will be described.

Referring to FIG. 3A, if command and address related to a read operation are applied through the port port0 in a packet form, the control block 100 generates an internal activation command signal (ACT), an activation array address (AAA) and a row address (RA) for the bank bank0 and activates a specific row (word line, WL). Then, the control block 100 generates an internal read command signal (RD), a read array address (RAA) and a read segment address (RSA) for the bank bank0. The bit line sense amplifier BLSA senses and amplifies 512-bit data of a segment corresponding to the read segment address (RSA), thus driving the transfer buses TB and TBb. Meanwhile, the bus connection block TL of the bank bank0 senses a read data applied on the transfer buses TB and TBb of the bank bank0 and drives data to the first global data bus GIO_UL. Then, the read data transferred to the first global data bus GIO_UL is stored in the read buffer of the port port0 through the receiver (Rx) of the data transfer block QTRX corresponding to the port port0. The data stored in the read buffer is converted into a packet of predetermined unit and transmitted to the target device connected to the port port0 in a serial data form. Then, the control block 100 generates an internal inactivation command signal (PCG) and an inactivation array address (PAA) to inactivate the row of the corresponding array. At this time, the transfer bus connection block TG of the corresponding array becomes a switched-off state, such that the transfer buses TB and TBb of the bank bank0 are disconnected from the transfer buses TB and TBb of the bank bank1 arranged within the same array. Reference numerals "BL" and "BLb" represent bit line pair, a reference numeral "T" represents a cell transistor, and a reference numeral "C" represents a cell capacitor.

Next, an operation of writing 512-bit data to a specific segment of the bank bank0 through the port port0 will be described.

Referring to FIG. 3B, if command, address and data related to a write operation are applied through the port port0 in a packet form, the control block 100 generates an internal activation command signal (ACT), an activation array address (AAA) and a row address (RA) for the bank bank0 and activates a specific row (word line, WL). Then, the control block 100 generates an internal write command signal (WT), a write array address (WAA) and a write segment address (WSA) for the bank bank0. At this time, 512-bit data stored in a write buffer of the port port0 are written to a segment (512 memory cells) corresponding to the write segment address (WSA) by a scheduling. The data converted into the parallel data at the port port0 are loaded on the first global data bus GIO_UL through the transmitter (Tx) of the data transfer block TR and are driven to the transfer buses TB and TBb of the bank bank0 through the bus connection block TL of the bank bank0. The data loaded on the transfer buses TB and TBb of the bank bank0 are stored in 512 memory cells through the bit line sense amplifiers BLSA corresponding to the write segment address (WSA). Then, the control block 100 generates an internal inactivation command signal (PCG) and an inactivation array address (PAA) to inactivate the row of the corresponding array.

FIGS. 4A and 4B illustrate a cross read path and a cross write path of the 256M multi-port DRAM of FIG. 2, respectively.

First, an operation of reading out 512-bit data from a specific segment of the bank bank0 through the port port1 will be described.

Referring to FIG. 4A, an overall operation is almost similar to the above-described normal read operation. A difference is that the transfer bus connection block TG of the corresponding array is in a switched-on state such that the transfer buses TB and TBb of the bank bank0 are connected to the transfer buses TB and TBb of the bank bank1 within the same array.

Meanwhile, the data loaded on the transfer buses TB and TBb of the bank bank1 are transferred to the target device through the bus transfer block TL of the bank bank1, the third global data bus GIO_DL, the data transfer block TR of the port port1, and the port port1 in sequence.

Next, an operation of writing 512-bit data to a specific segment of the bank bank0 through the port port1 will be described.

Referring to FIG. 4B, an overall operation is almost similar to the above-described normal write operation. A difference is that the transfer bus connection block TG of the corresponding array is in a switched-on state such that the transfer buses TB and TBb of the bank bank0 are connected to the transfer buses TB and TBb of the bank bank1 within the same array. In this case, the data applied on the port port1 are loaded on the transfer buses TB and TBb of the bank bank0 through the bus transfer block TR of the port port1, the third global data bus GIO_DL, and the bus connection block TL of the bank bank1 in sequence. Following procedures are identical to the above-described normal write operation.

Meanwhile, in case where data exchange between the first global data bus GIO_UL and the second global data bus GIO_UR is required, the two global data buses are connected through the first global data bus connection block PR_U. In case where data exchange between the third data global data bus GIO_DL and the fourth global data bus GIO_DR is required, the two global data bus lines are connected through the second global data bus connection block PR_D.

Since the proposed 256M multi-port DRAM can access all segments at all ports port0 to port7 and also provide an independent access through a plurality of ports, a multi access is possible within a range in which the global data buses are not used overlappingly. Also, since the 256M multi-port DRAM can process 512-bit data in parallel at the respective quarters of the core area through an application of the new architecture and can input/output data in serial at the ports. Accordingly, an increase of a layout area is minimized, a packaging is simplified, and a bandwidth is greatly increased without causing a skew between data lines at the data buses.

FIG. 5 is a block diagram illustrating a command and data transmission structure of the 256M multi-port DRAM shown in FIG. 1.

Referring to FIG. 5, the control block generates all command signals used in the DRAM and controls an operation of DRAM. In other words, the control block is a kind of a DRAM controller. It can be said that the proposed multi-port DRAM has the DRAM controller inside the chip.

As described above, the port supports the serial I/O interface and processes I/O by a serial packet unit just like a communication interface. Unit packet includes data, address and command. A command that is extracted from a packet interpreter disposed within the port is transferred to the control block, and the control block generates a command signal, an address signal and a control signal, which are necessary for performing a corresponding command.

Transmission pads Tx− and TX+ connected to the port are pads for outputting data, and reception pads RX− and RX+ are pads for inputting data, address and command. In other words, the data I/O pads are separated from each other and I/Os are configured with a differential pair, so that it is advantageous to a high speed operation. Meanwhile, in addition to the transmission pads TX− and TX+ and the reception pads RX− and RX+, clock pads CLK− and CLK+ are provided to supply a clock used inside the chip. Also, a Test_en pad, a CS_L pad, an MDIO pad and an MDCK pad are provided so that an operation mode of the chip can be switched.

As described above, the packet interpreter transfers the command to the control block. The data process at the port is applied on the global data bus GIO through the data transfer block QTRX, and passes through the bus connection block TL, and it is then transferred to a cell matrix through a bus a transfer bus TB.

Meanwhile, the control block receives a port command port_cmd and generates a DRAM command dram_cmd, an address and a control signal. The DRAM command dram_cmd is applied to the inside of the bank through an input buffer. The input buffer is a kind of a level shifter and performs a buffering operation.

FIG. 6 is a block diagram of the 256M multi-port DRAM shown in FIG. 1.

Referring to FIG. 6, the 256M multi-port DRAM includes four quarters Quarter_lu, Quarter_ru, Quarter_ld and Quarter_rd around the control block. One quarter independently operates just like one DRAM. As described above, an access to all cells are possible through the transfer bus connection block TG and the global data bus connection blocks PR_U and PR_D, regardless of the locations of the quarters in which the ports are disposed.

Since the conventional DRAM uses the parallel interface, the test can be performed using an inherent function of each pad. However, since the multi-port DRAM must test DRAM by determining data inputted in the serial mode, the existing test method cannot be applied to the multi-port DRAM.

SUMMARY OF THE INVENTION

It is, therefore, an object of the present invention to provide a multi-port memory device having a serial I/O interface, which is capable of providing an operation test without any collision with an internal command/address generation path through a limited external pin.

In an aspect of the present invention, there is provided a multi-port memory device comprising a plurality of ports supporting a serial I/O interface, the plurality of ports including a transmission pad and a reception pad, the multi-port memory device comprising: a memory core; a control means for generating an internal command signal, an internal address and a control signal, which correspond to the command and are necessary for an operation of the memory core, using commands and addresses inputted to the plurality of ports in a packet form; and a mode selection means for combining signals applied to a plurality of mode selection pads and generating a test mode flag signal, wherein I/O data assigned to the transmission pad and the reception pad in a test mode in response to the test mode flag signal are exchanged with the memory core through the ports, and the command, the address and the control signal assigned to the transmission pad and the reception pad in the test mode are bypassed at the control means and provided to the memory core.

Preferably, the multi-port memory device further comprises: an entry input pad allocated to an MRS command for providing a reliability test in the test mode; and a test logic for providing a plurality of test modes for the memory core in response to the MRS command applied to the entry input pad and the address bypassed at the control means.

Preferably, the multi-port memory device further comprises a summation logic for summing the command and the address bypassed at the control means in the test mode in response to the test mode flag signal in order to check a bypass stability.

Preferably, the multi-port memory device further comprises a wafer test pad for outputting an output of the summation logic to an exterior.

Preferably, the control means performs a buffering operation during a process of bypassing the command, the address and the control signal, which are assigned to the transmission pad and the reception pad in the test mode, and provides the buffered signals as an internal command signal, an internal address signal and an internal control signal to the memory core, the internal command signal, the internal address signal and the internal control signal being not used at the same time.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, the present invention will be described in detail with reference to the accompanying drawings.

Figure 1:
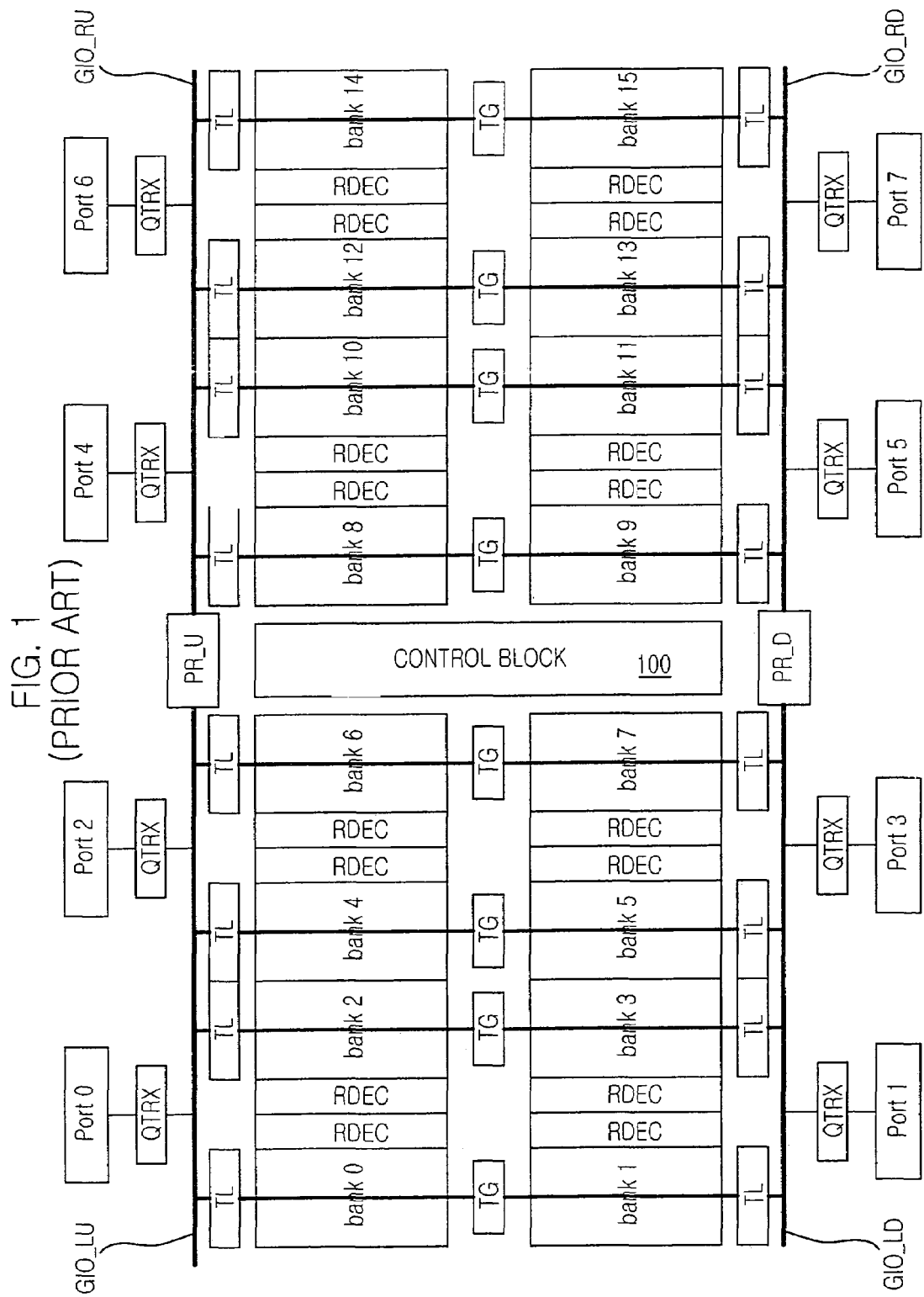
FIG. 1 illustrates an architecture of a 256M multi-port DRAM, which is disclosed in Korean Patent Application No. 2003-92375.
Figure 2:
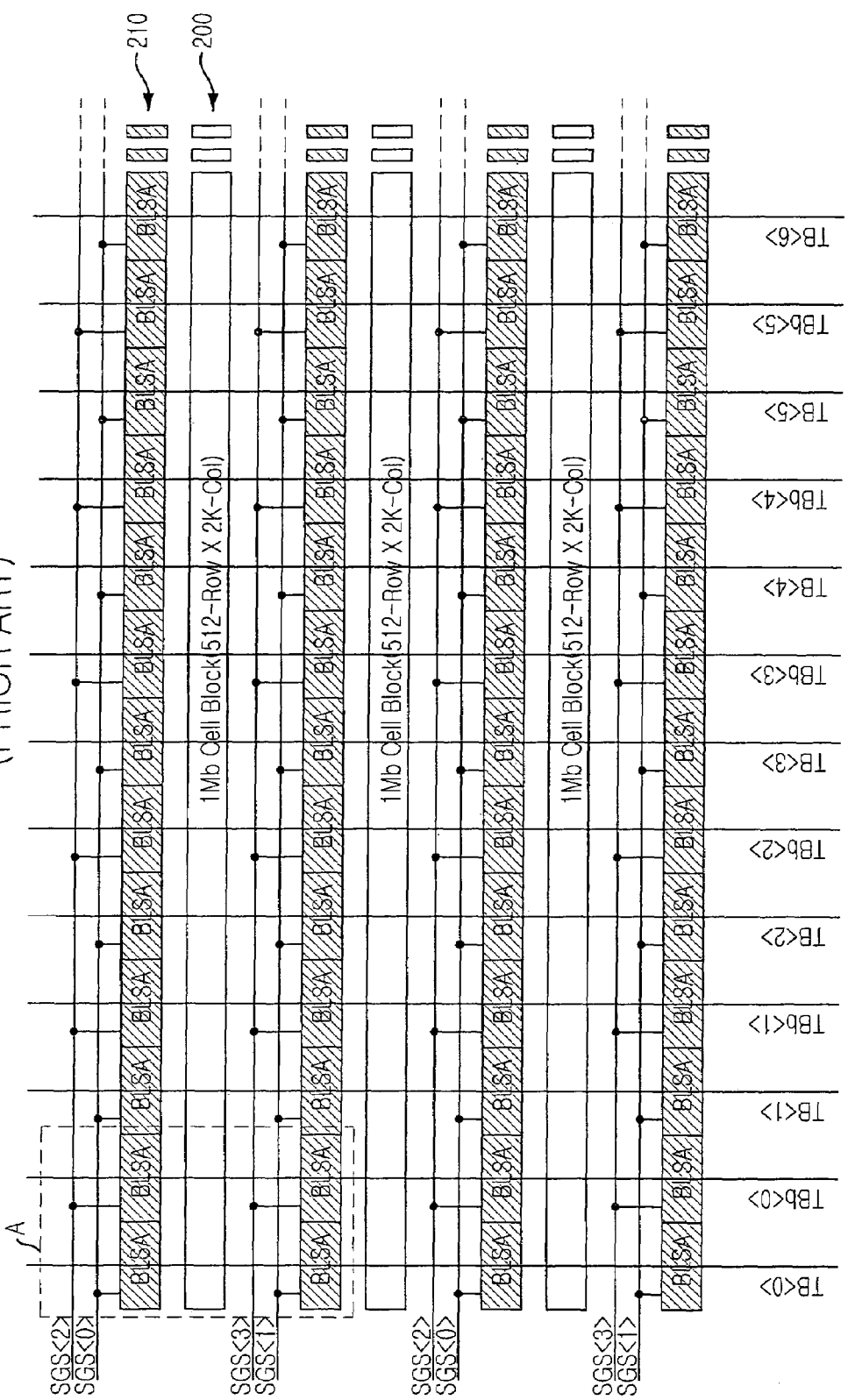
FIG. 2 is a block diagram illustrating a segment and a transfer bus TB in the 256M multi-port DRAM of FIG. 1.
Figure 3A:
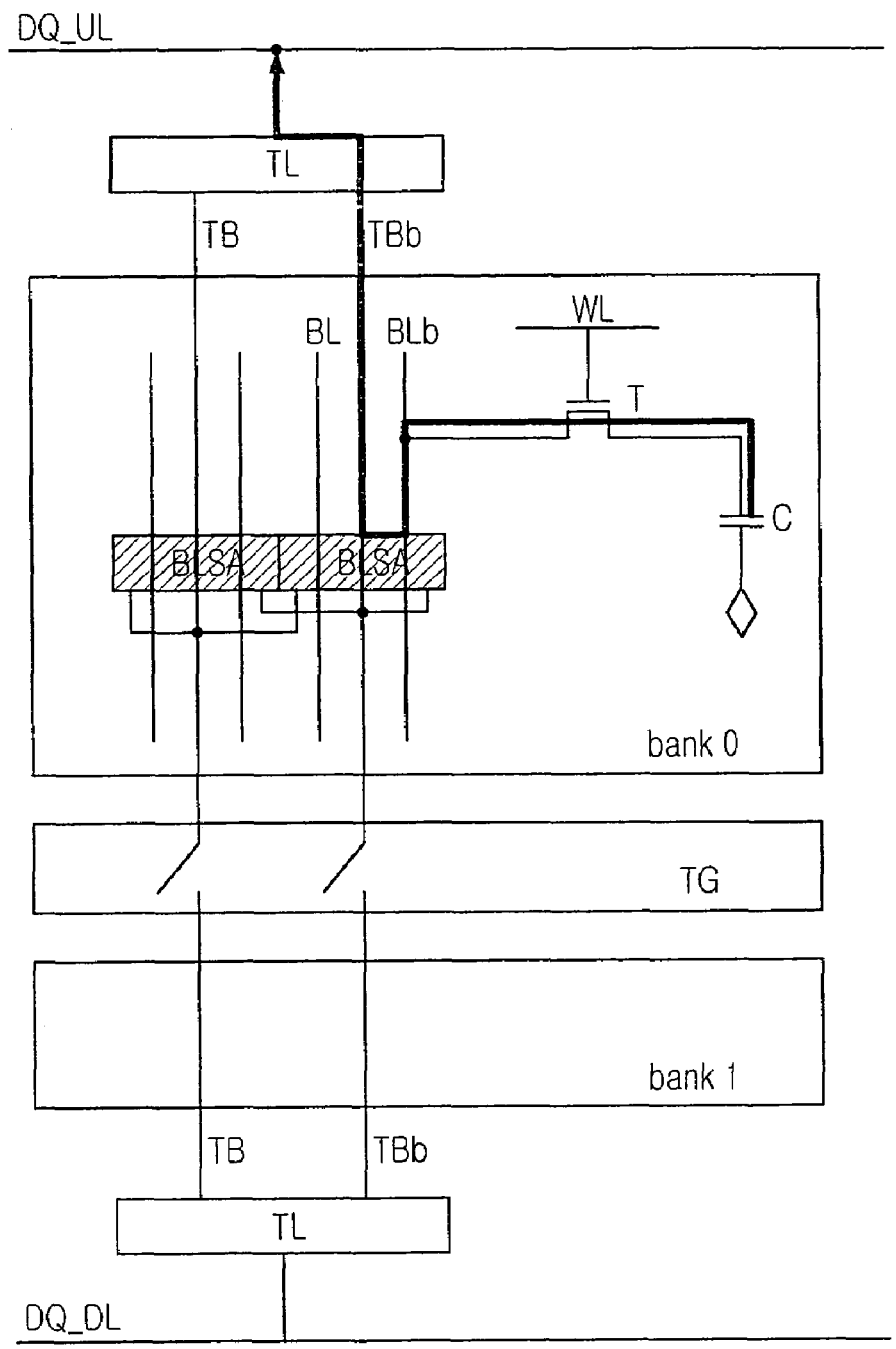
FIG. 3A illustrates a normal read path of the 256M multi-port DRAM depicted in FIG. 2.
Figure 3B:
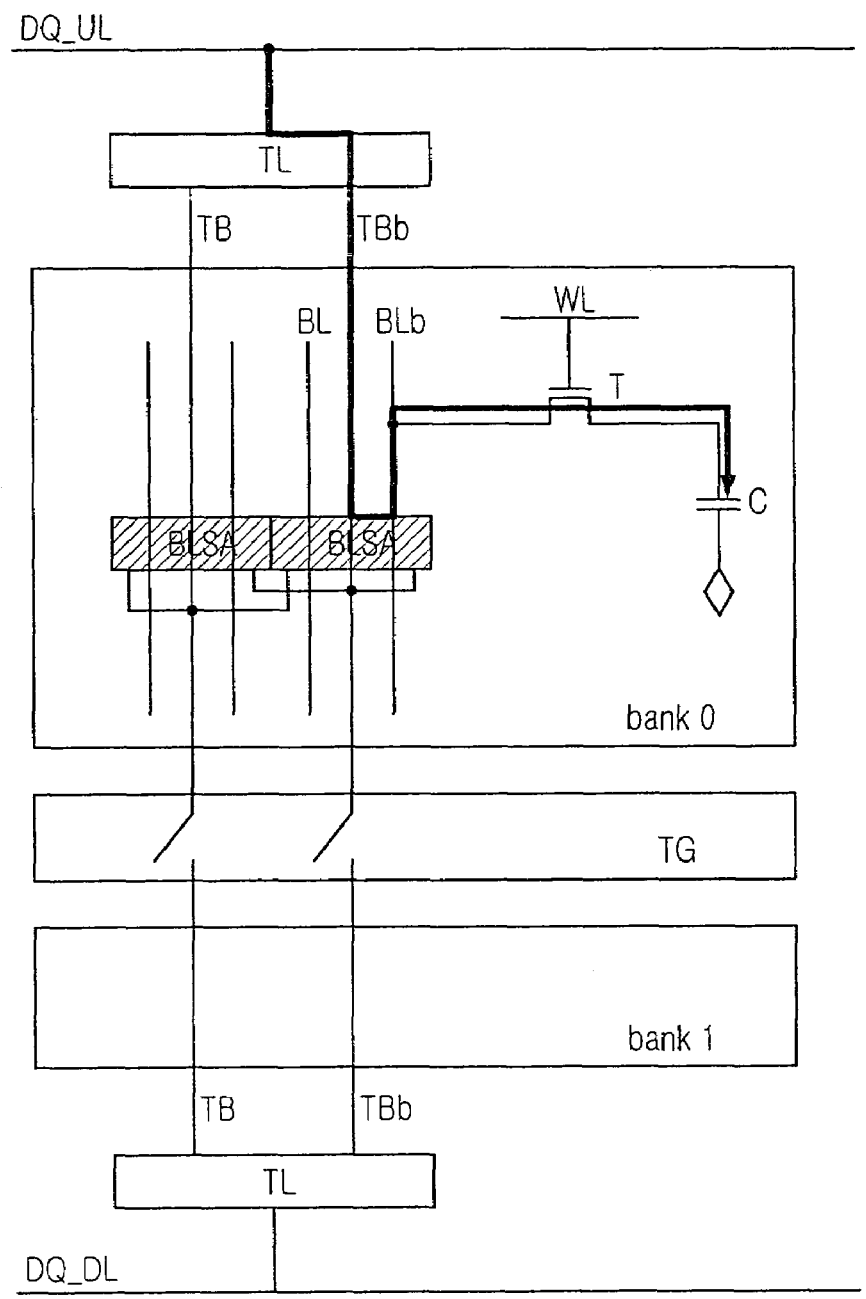
FIG. 3B illustrates a normal write path of the 256M multi-port DRAM depicted in FIG. 2.
Figure 4A:
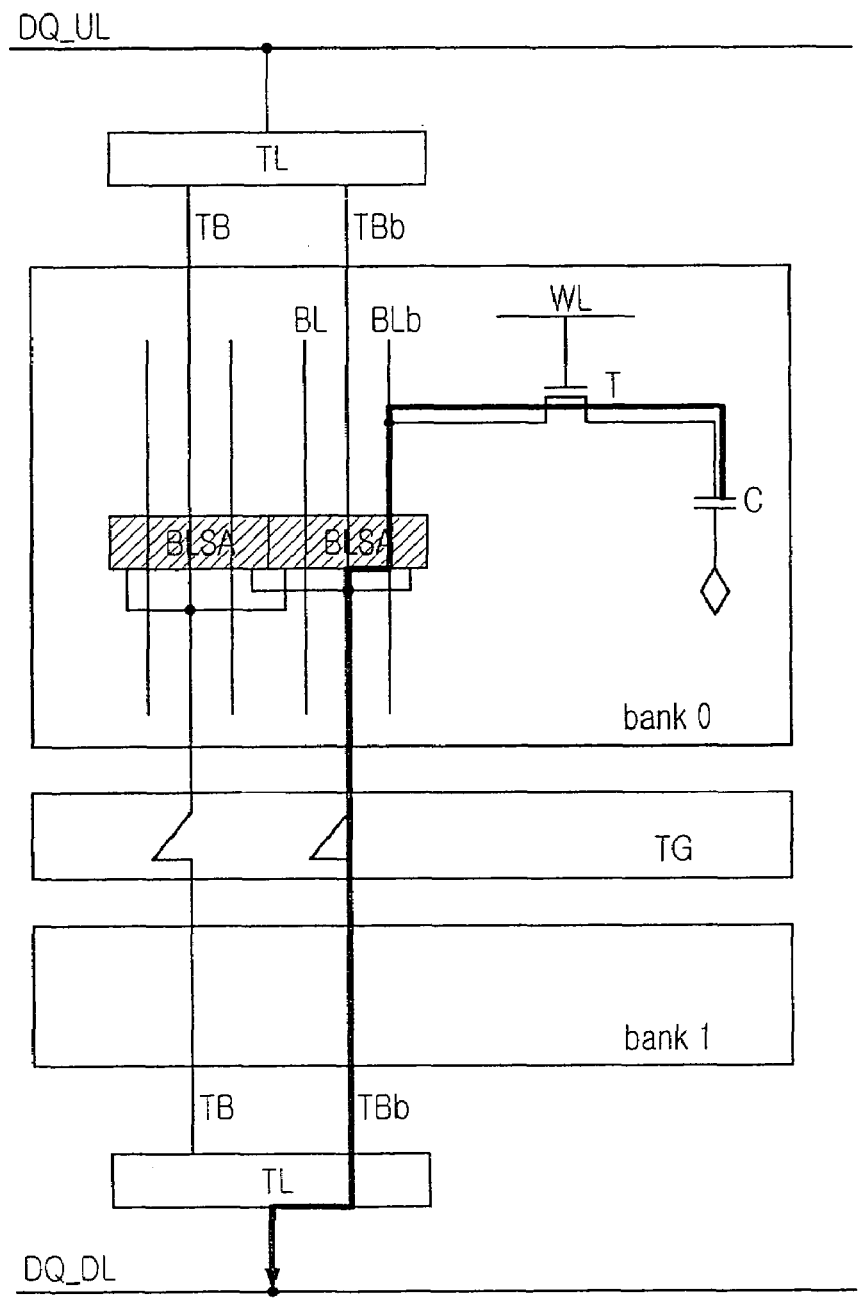
FIG. 4A illustrates a cross read path of the 256M multi-port DRAM depicted in FIG. 2.
Figure 4B:
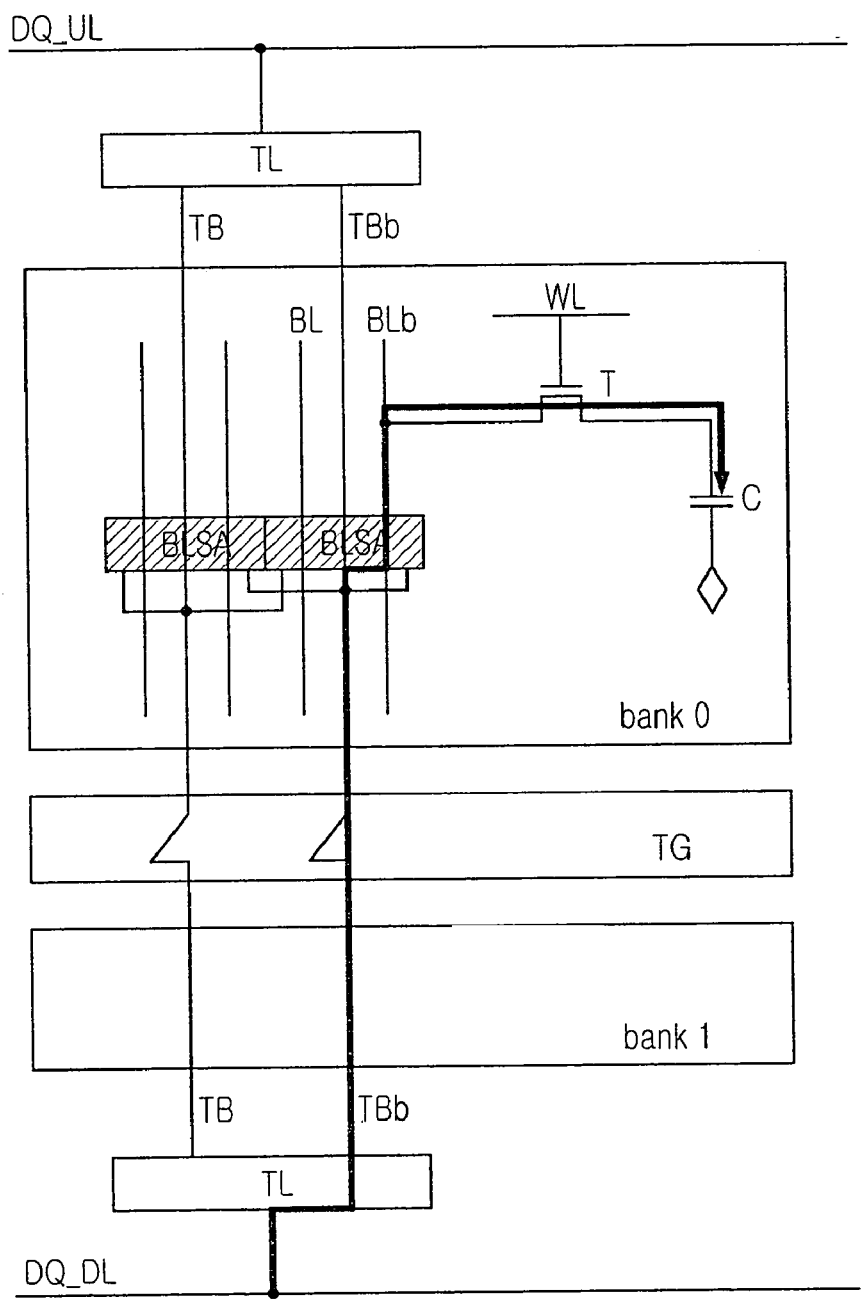
FIG. 4B illustrates a cross write path of the 256M multi-port DRAM depicted in FIG. 2.
Figure 5:
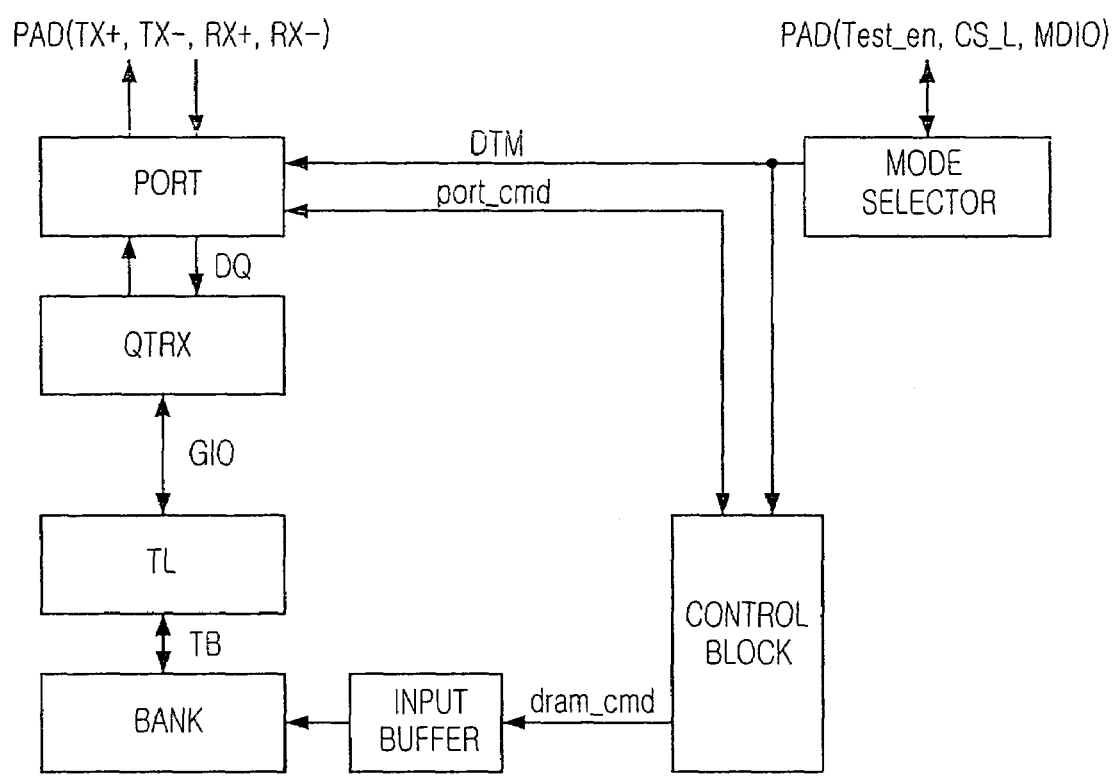
FIG. 5 is a block diagram illustrating a command and data transmission structure of the 256M multi-port DRAM shown in FIG. 1.
Figure 6:
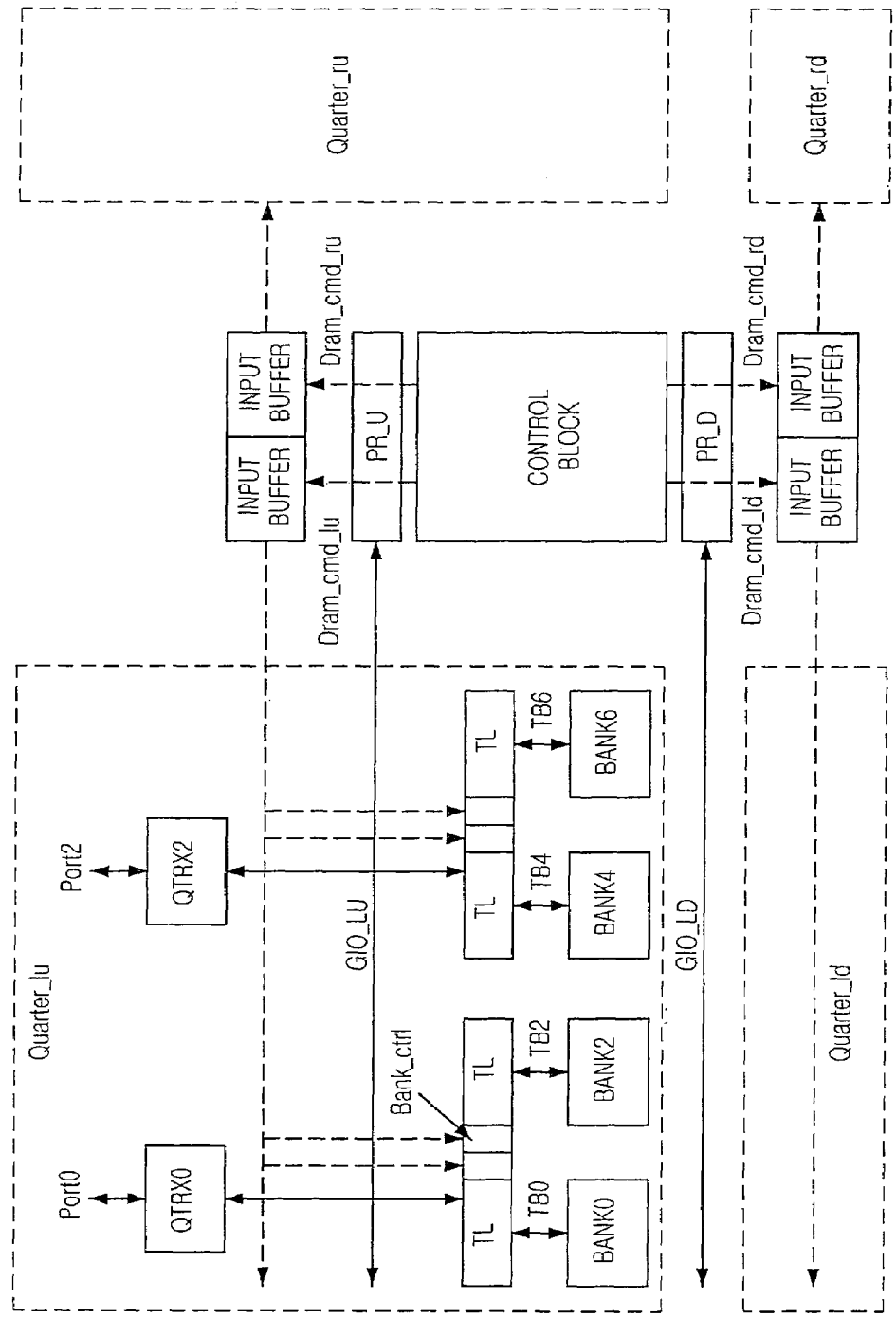
FIG. 6 is a block diagram of the 256M multi-port DRAM shown in FIG. 1.
Figure 7:
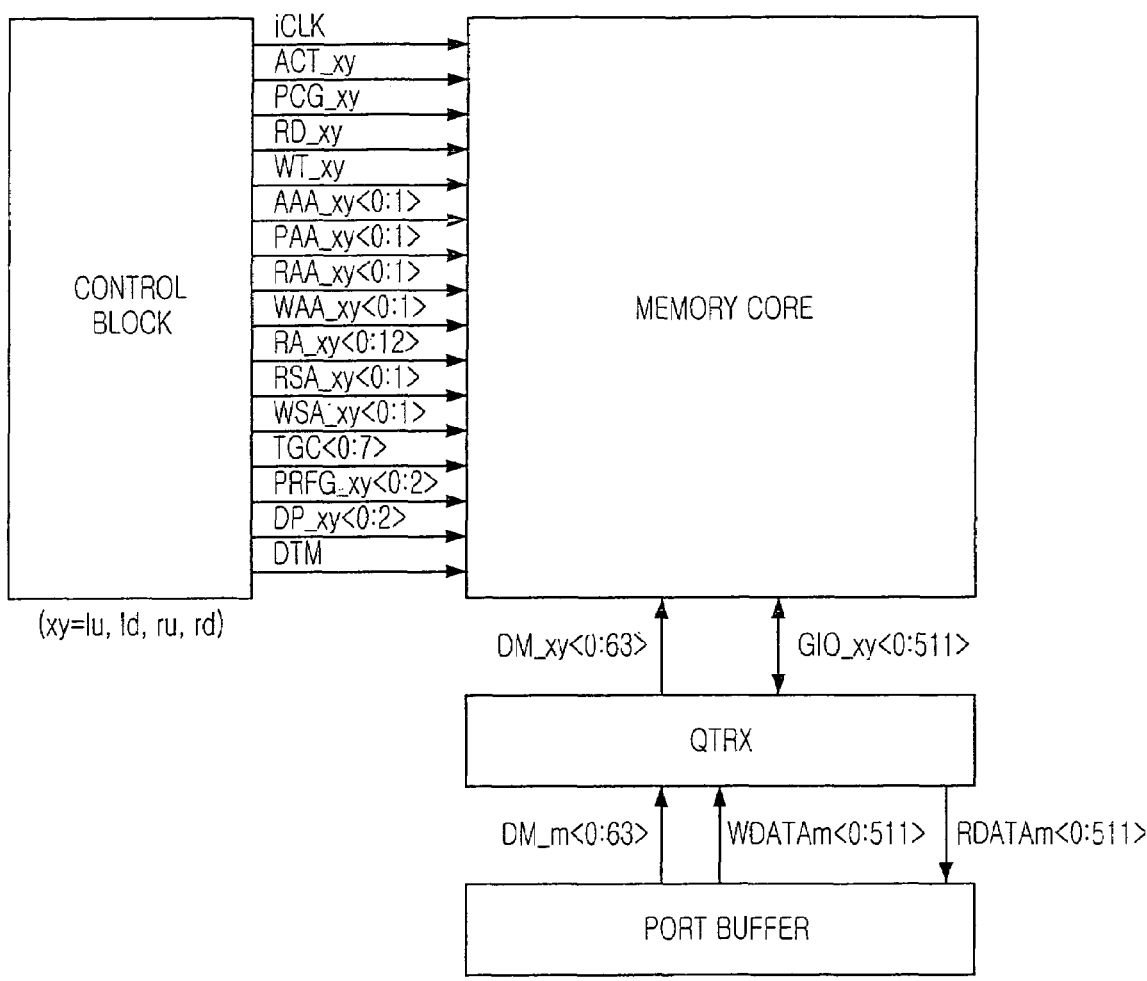
FIG. 7 illustrates all signals provided to a memory core of a 256M multi-port DRAM shown in FIG. 1.

FIG. 7 illustrates all signals provided to a memory core of a 256M multi-port DRAM shown in FIG. 1.

Referring to FIG. 7, 64-bit data mask signals DMm<0:63> and 512-bit write data WDATAm<0:511> are provided from a port buffer to a memory core.

A control block generates internal command signals, internal address signals, and control signals, control signals, and an internal clock iCLK. Here, the internal command signals include an internal activation command signal ACT, an internal inactivation command signal PCG, an internal read command signal RD, an internal write command signal WD, and so on. The internal address signals include an activation array address AAA, an inactivation array address PAA, a read array address RAA, a write array address WAA, a row address RA, a read segment address RSA, a write segment address WSA, and so on. The control signals include a transfer gate control signal TGC, a port/pipe register flag signal PRFG, a port/pipe register data driving signal DP, a DRAM core test mode flag signal DTM, and so on.

In order to test the multi-port DRAM having the serial I/O interface, it must be provided a method of supplying commands and addresses of about 40 lines through external limited pins with respect to four quarters in such a state that the control block supplies the addresses and commands necessary for the DRAM.

Figure 8:
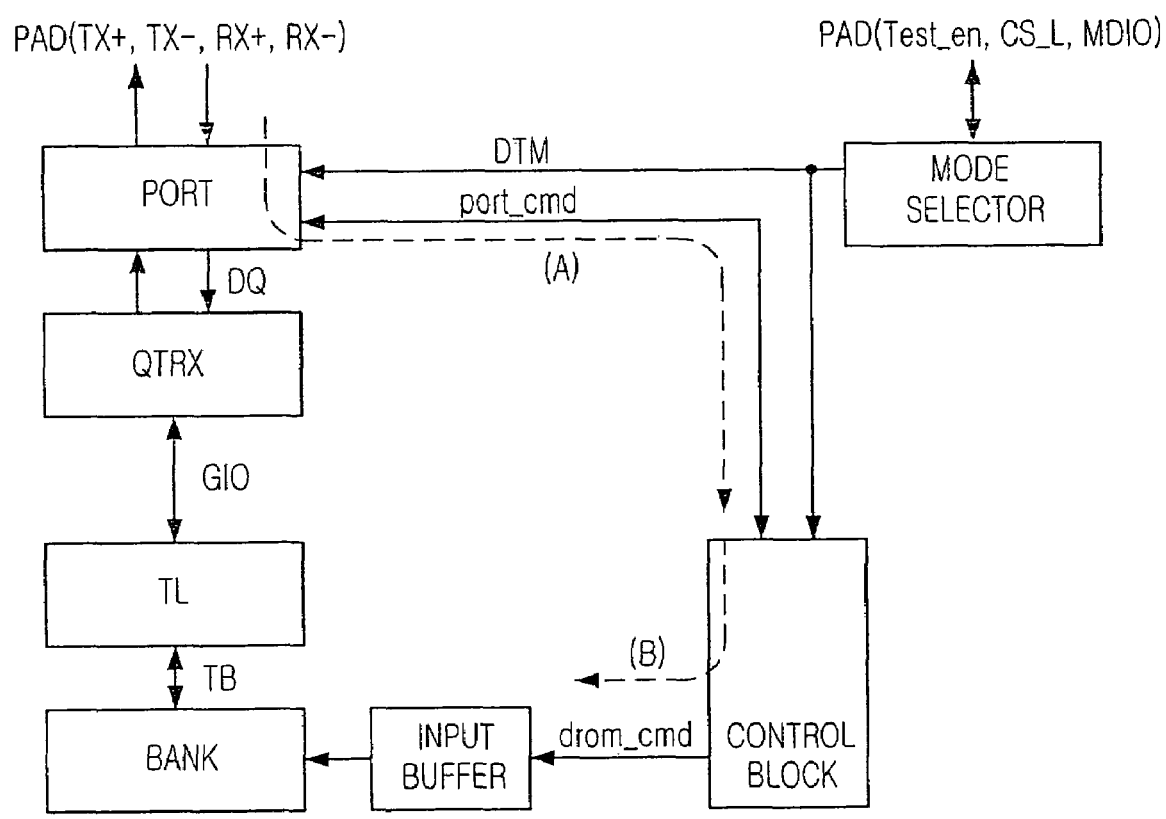
FIG. 8 is a conceptual diagram of a command transmission structure in a test mode of the multi-port DRAM having a serial I/O interface in accordance with the present invention.

FIG. 8 is a conceptual diagram of a command transmission structure in a test mode of the multi-port DRAM having the serial I/O interface in accordance with the present invention.

Referring to FIG. 8, a mode selector combines signals which are applied to the Test_en pad, the CS_L pad and the MDIO pad and determines an operation mode of the DRAM. In the test mode, the mode selector generates the DRAM core test mode flag signal DTM. The DRAM core test mode flag signal DTM is a signal which is activated to a logic high level in the test mode.

The DRAM core test mode flag signal DTM is applied to the port and bypasses a path of an inside of the port connected to the external pins TX+, TX−, RX+ and RX−, such that the signals applied through the external pins are loaded on the port command (port_cmd) line. Also, the DRAM core test mode flag signal DTM is applied to the control block, and the signals loaded on the port command (port_cmd) are selectively bypassed at the control block and outputted as the DRAM command dram_cmd.

In such a bypass process, the signals applied on the transmission/reception pads TX+, TX−, RX+ and RX− can be provided into the memory core as the DRAM command dram_cmd. Also, the ports and the control block performs a buffering to the applied signals, not performing a basic operation of a normal mode.

Due to the introduction of such conception, a basis of testing DRAM by controlling pin inputs is prepared. Since the serial I/O interface has the limited number of pads owing to its characteristic, the pins must be efficiently arranged in order to implement many operations with a small number of pins.

Figure 9:
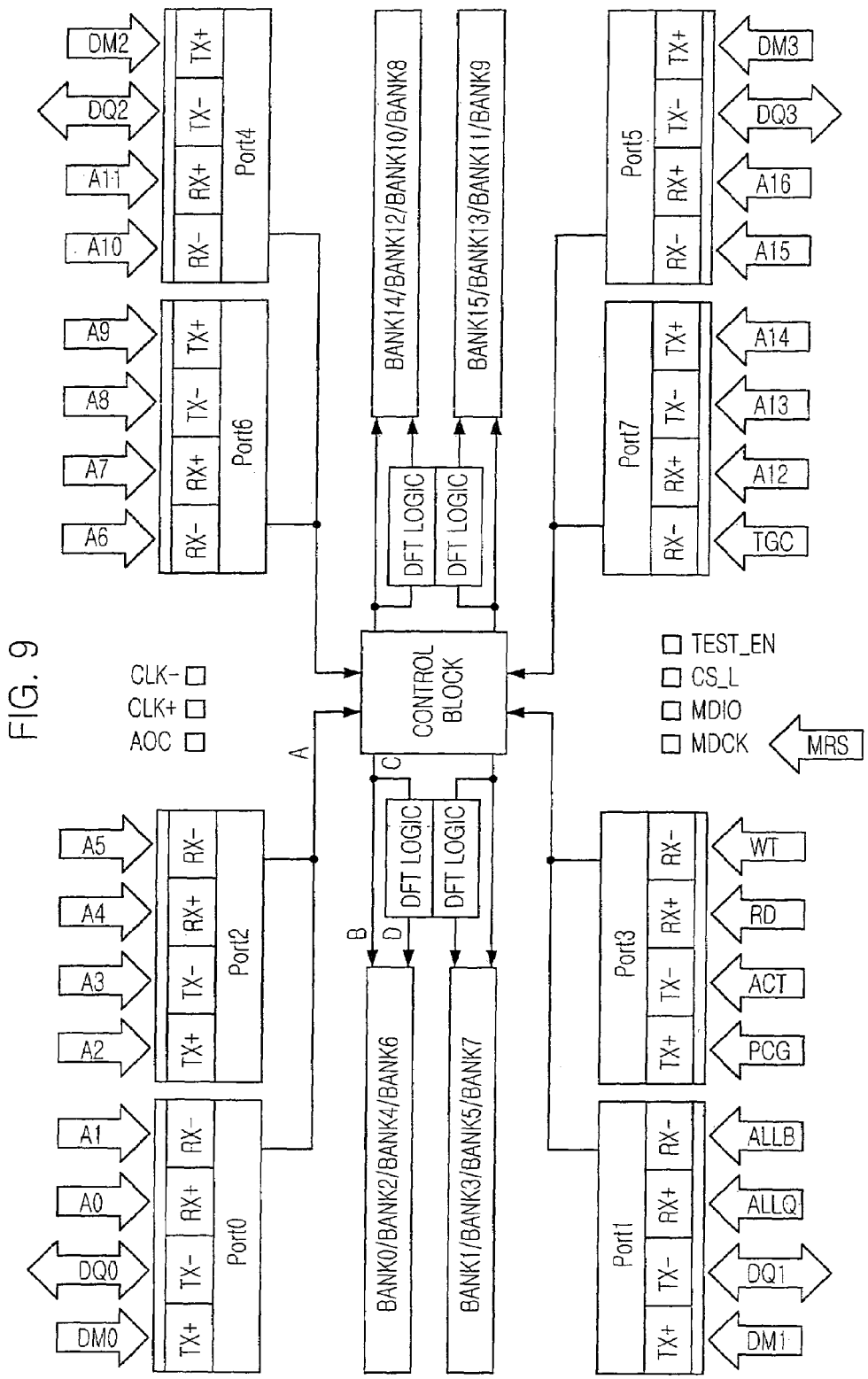
FIG. 9 illustrates a pin arrangement for a test mode of the 256M multi-port DRAM in accordance with an embodiment of the present invention.

FIG. 9 illustrates a pin arrangement for a test mode of the 256M multi-port DRAM in accordance with an embodiment of the present invention.

Referring to FIG. 9, two ports are arranged at every quarter, and each quarter includes four transmission/reception pads TX+, TX−, RX+ and RX−. According to the present invention, in the test mode, each quarter includes one data I/O pad and one data mask signal input pad. The remaining pads are allocated as address pads A0 to A16 for selecting DRAM cells, command pads WT, RD, ACT and PCG, and control signal pads TGC, ALLQ and ALLB without regard to distinguishing the quarters.

Meanwhile, the 256M multi-port DRAM in accordance with the present invention further includes a DFT logic which is disposed between the control block of each quarter and the bank. The DFT logic receives the addresses bypassed at the control block and generates a flag signal D in order for a reliability test and burn-in test.

Here, "A" denotes a command/address bypassed at the port, "B" denotes a command/address bypassed at the control block, and "C" denotes an address bypassed at the control block.

As described above, except for the port, mode decision pads, such as clock pads CLK− and CLK+, a TEST_en pad, a CS_L pad, an MDIO pad and an MDCK pad, are provided. In the test mode, the same signals as those in the normal mode are applied to these pads. However, the MDCK which has no relation to the test mode is used as an MRS, which is an entry input pad, for providing the reliability test in the test mode.

Meanwhile, an AOC pad is used for a wafer test pad, not a package pad. The AOC pad is a pad which is added for checking whether external pin inputs (C, command and address) bypassed at the ports and the control block are generated as outputs of the control block.

The bypass method of the control block in the test mode will now be described in detail.

For example, if the activation command ACT is applied to the pad in the test mode, the control block buffers the activation command ACT and generates four DRAM commands ACT_lu, ACT_ld, ACT_ru and ACT_rd, which correspond to the respective quarters. The addresses A<1:0> are outputted as the read segment address RSA<1:0>, the write segment address WSA<1:0> and the row address RA<1:0> according to the command. Since these signals are not used at the same time according to the respective commands, the pads can be shared. In this manner, it is possible to overcome an environment in which pins are limited.

Also, the write command WT applied to the pad is buffered at the control block in the test mode and is generated as the write segment address enable signal WSAE and the port/pipe register driving control signal DP<0>. The ALLB signal and the ALLQ signal applied to the pad are buffered at the control block in the test mode and are outputted as the port/pipe register driving control signals DP<2> and DP<1>. In addition, the read command RD applied to the pad is buffered at the control block in the test mode and is outputted as the read segment address enable signal RSAE and the port/pipe register flag signal PRFG<0>. The addresses A<16:15> is outputted as the port/pipe register flag signals PRFG<2:1> in the test mode.

Figure 10:
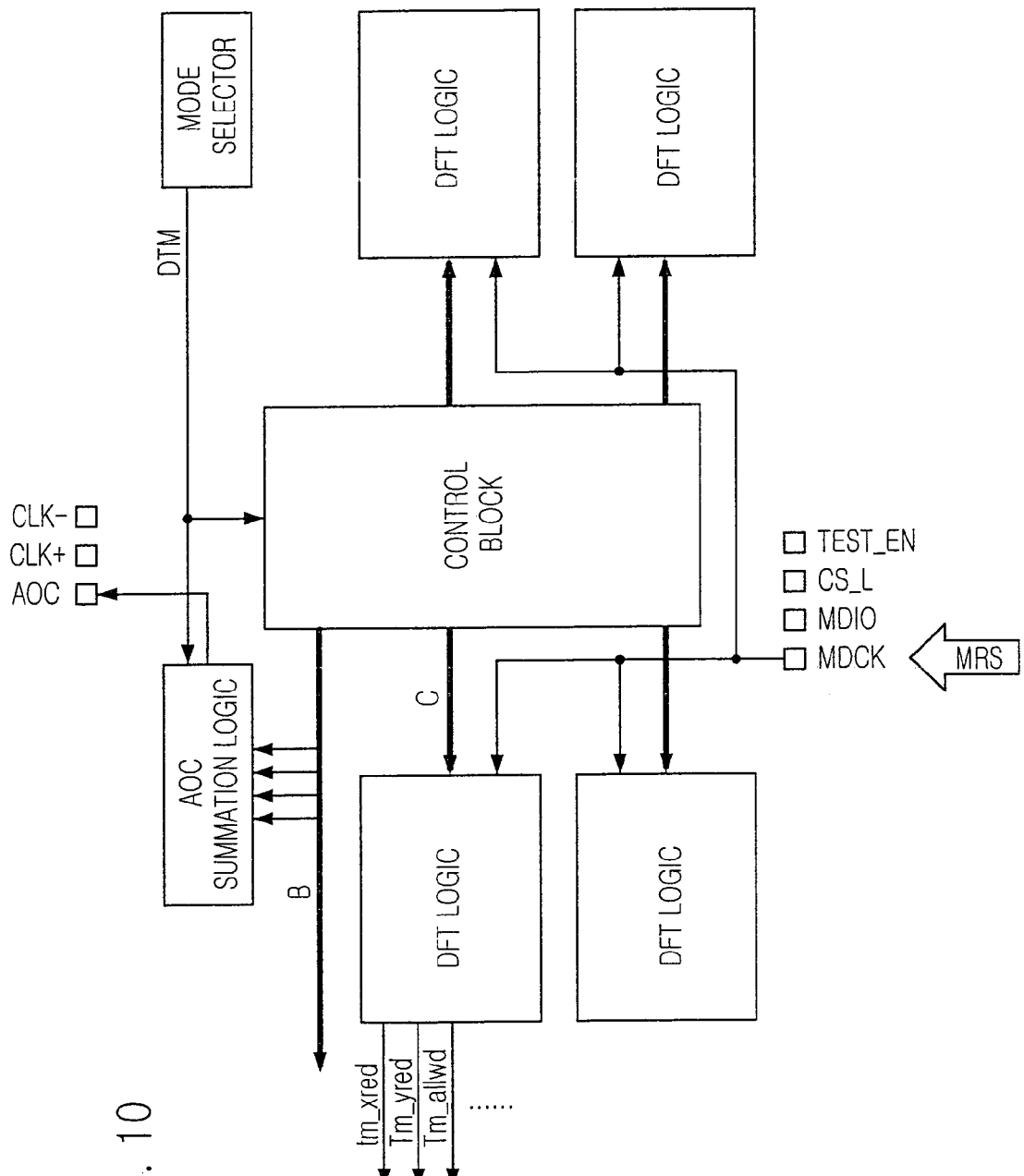
FIG. 10 is a block diagram illustrating a connection state of an MRS pad and an AOC pad of FIG. 9.

FIG. 10 is a block diagram illustrating a connection state of the MRS pad and the AOC pad of FIG. 9.

Referring to FIG. 10, the MRS command is inputted to the DFT logic of each quarter and generates a variety of flag signals for the DRAM test together with the addresses bypassed at the control block.

Although not shown in FIG. 9, the multi-port DRAM in accordance with an embodiment of the present invention further includes an AOC summation logic for checking the bypass stability. The AOC summation logic sums the command and the address, which are bypassed at the control block, in response to the DRAM core test mode flag signal DTM. An output of the AOC summation logic is transferred to an AOC pad, such that an internal bypass state can be checked at the exterior.

Figure 11:
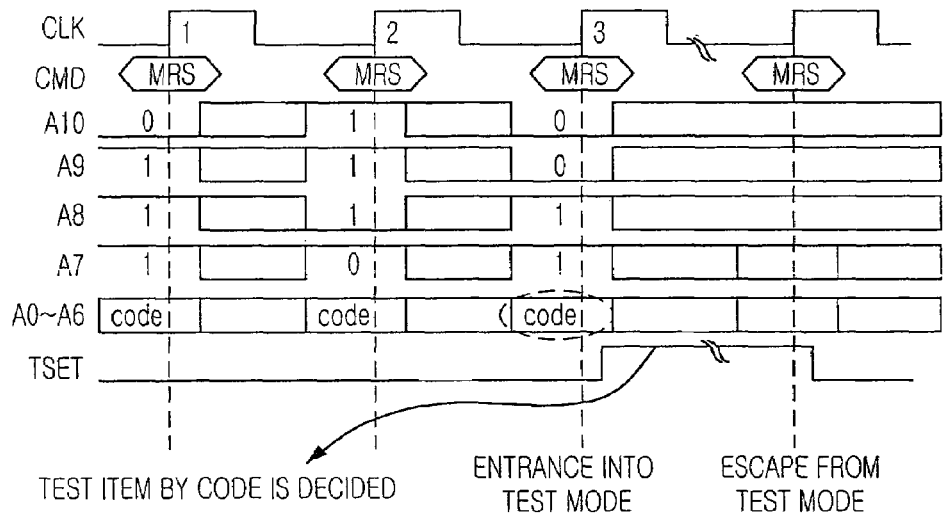
FIG. 11 is a timing diagram of a case when a DFT flag signal is generated using an MRS command.

FIG. 11 is a timing diagram of a case when the DFT flag signal is generated using the MRS command.

In FIG. 11, a test item is decided using the MRS command, the addresses A0 to A6 and the addresses A7 to A10 bypassed at the control block.

Figure 12:
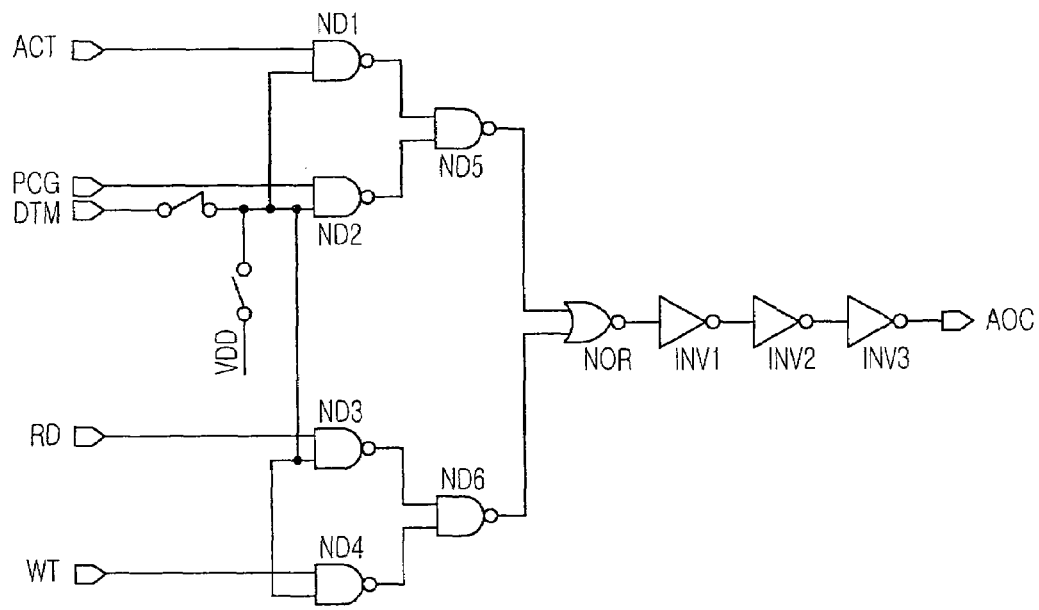
FIG. 12 is a circuit diagram of an AOC summation logic shown in FIG. 10.

FIG. 12 is a circuit diagram of the AOC summation logic shown in FIG. 10.

Referring to FIG. 12, the AOC summation logic includes: a NAND gate ND1 configured to receive the activation command ACT and the DRAM core test mode flag signal DTM; a NAND gate ND2 configured to receive the inactivation command PCG and the DRAM core test mode flag signal DTM; a NAND gate ND3 configured to receive the read command RD and the DRAM core test mode flag signal DTM; a NAND gate ND4 configured to receive the write command WT and the DRAM core test mode flag signal DTM; a NAND gate ND5 configured to receive outputs of the NAND gates ND1 and ND2; a NAND gate ND6 configured to receive outputs of the NAND gates ND3 and ND4; a NOR gate NOR configured to receive outputs of the NAND gates ND5 and ND6; an inverter INV1 configured to receive an output of the NOR gate NOR; an inverter INV2 configured to receive an output of the inverter INV1; and an inverter INV3 configured to receive an output of the inverter INV2 and output the AOC signal.

Here, the AOC signal is activated when any one of the activation command ACT, the inactivation command PCG, the read command RD and the write command WT is activated.

In the above-described embodiments, the number of ports and the number of banks can be changed depending on the capacity of the memory device.

In accordance with the present invention, the multi-port memory device supporting the serial I/O interface can overcome the limitation of the restricted pins, such that various tests for the memory core are possible. Thus, the reliability of the multi-port memory device supporting the serial I/O interface can be secured.

The present application contains subject matter related to Korean patent applications No. 2004-31980, filed in the Korean Patent Office on May 6, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A multi-port memory device comprising a plurality of ports supporting a serial I/O interface, the plurality of ports including a transmission pad and a reception pad, the multi-port memory device comprising:

a memory core;

a control means for generating an internal command signal, an internal address and a control signal, which correspond to the command and are necessary for an operation of the memory core, using commands and addresses inputted to the plurality of ports in a packet form; and a mode selection means for combining signals applied to a plurality of mode selection pads and generating a test mode flag signal, wherein I/O data assigned to the transmission pad and the reception pad in a test mode in response to the test mode flag signal are exchanged with the memory core through the ports, and the command, the address and the control signal assigned to the transmission pad and the reception pad in the test mode are bypassed at the control means and provided to the memory core.

2. The multi-port memory device as recited in claim 1, further comprising:

an entry input pad allocated to an MRS command for providing a reliability test in the test mode; and a test logic for providing a plurality of test modes for the memory core in response to the MRS command applied to the entry input pad and the address bypassed at the control means.

3. The multi-port memory device as recited in claim 1, further comprising a summation logic for summing the command and the address bypassed at the control means in the test mode in response to the test mode flag signal in order to check a bypass stability.

4. The multi-port memory device as recited in claim 3, further comprising a wafer test pad for outputting an output of the summation logic to an exterior.

5. The multi-port memory device as recited in claim 1, wherein the control means performs a buffering operation during a process of bypassing the command, the address and the control signal, which are assigned to the transmission pad and the reception pad in the test mode, and provides the buffered signals as an internal command signal, an internal address signal and an internal control signal to the memory core, the internal command signal, the internal address signal and the internal control signal being not used at the same time.

* * * * *